(12) United States Patent
Stahl-Offergeld et al.

(10) Patent No.: US 11,977,132 B2
(45) Date of Patent: May 7, 2024

(54) MAGNETIC-FIELD SENSOR ARRANGEMENT AND METHOD OF CALIBRATING A MAGNETIC-FIELD SENSOR OF A MAGNETIC-FIELD SENSOR ARRANGEMENT

(71) Applicant: Fraunhofer-Gesellschaft zur Förderung der angewandten Forschung e.V., Munich (DE)

(72) Inventors: Markus Stahl-Offergeld, Erlangen (DE); Dennis Krause, Erlangen (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 140 days.

(21) Appl. No.: 17/390,391

(22) Filed: Jul. 30, 2021

(65) Prior Publication Data
US 2022/0034977 A1    Feb. 3, 2022

(30) Foreign Application Priority Data
Jul. 31, 2020   (DE) .......................... 102020209722.4

(51) Int. Cl.
G01R 33/00      (2006.01)
G01R 33/02      (2006.01)
G01R 33/07      (2006.01)

(52) U.S. Cl.
CPC ..... *G01R 33/0035* (2013.01); *G01R 33/0206* (2013.01); *G01R 33/077* (2013.01)

(58) Field of Classification Search
CPC ............ G01R 33/0035; G01R 33/0206; G01R 33/077; G01R 33/0017; G01R 33/09
See application file for complete search history.

(56) References Cited

U.S. PATENT DOCUMENTS 9,179,066 B1 * 11/2015 Tsai ....................... G01R 15/20
2012/0212216 A1 * 8/2012 Stahl-Offergeld ... G01R 33/077
                                                            324/251

(Continued)

FOREIGN PATENT DOCUMENTS

DE    102010028390 B4    12/2012
EP         2490037 B1     2/2014

(Continued)

*Primary Examiner* — Catherine T. Rastovski
*Assistant Examiner* — Yossef Korang-Beheshti
(74) *Attorney, Agent, or Firm* — Perkins Coie LLP; Michael A. Glenn

(57) ABSTRACT

Magnetic-field sensor arrangement comprises a magnetic-field sensor for providing a sensor output signal based on a magnetic field acting on the sensor; an excitation-conductor array including selectively driveable excitation conductors spaced from the magnetic-field sensor; a driver for selectively driving the excitation conductors to generate different magnetic test fields in different drive states by driving a different excitation conductor, and to generate a set of detected output signal values of the magnetic-field sensor according to the different drive states; and evaluator configured to provide different parameter sets including comparison output signal values for the different drive states and representing variations of the architecture of the magnetic-field sensor including the excitation-conductor array, and further configured to determine, based on the set of detected output signal values of the magnetic-field sensor, that parameter set whose comparison output signal values exhibit a best match with the set of detected output signal values.

23 Claims, 4 Drawing Sheets

(56) References Cited

U.S. PATENT DOCUMENTS

| | | |
|---|---|---|
| 2012/0215475 A1 | 8/2012 | Rutledge et al. |
| 2013/0057256 A1* | 3/2013 | Ernst ...................... G01R 33/07 |
| | | 324/202 |
| 2017/0363693 A1* | 12/2017 | Polley .................. G01R 33/075 |
| 2018/0292469 A1 | 10/2018 | Hohe et al. |
| 2019/0107585 A1 | 4/2019 | Huber Lindenberger et al. |
| 2020/0393529 A1* | 12/2020 | Larson ................. G01R 15/202 |
| 2021/0190893 A1* | 6/2021 | Huber Lindenberger ................... |
| | | G01R 33/075 |

FOREIGN PATENT DOCUMENTS

| | | | |
|---|---|---|---|
| EP | 3179330 | A2 | 6/2017 |
| EP | 3341746 | B1 | 8/2019 |

* cited by examiner

100

```
┌─────────────────────────────────────────────┐
│ Selectively driving the excitation conductors so as │
│ to generate different magnetic test fields in the magnetic-field │
│ sensor in different drive states by driving a different │─── 110
│ excitation conductor, and so as to generate a set of detected │
│ output signal values of the magnetic-field sensor in │
│ accordance with the different drive states │
└─────────────────────────────────────────────┘
```

```
┌─────────────────────────────────────────────┐
│ Providing different parameter sets comprising comparison │
│ output signal values for the different drive states, │
│ the parameter sets representing variations of the │─── 120
│ architecture of the magnetic-field sensor comprising │
│ the excitation-conductor array │
└─────────────────────────────────────────────┘
```

```
┌─────────────────────────────────────────────┐
│ Determining, on the basis of the set of detected │
│ output signal values of the magnetic-field sensor, │
│ that parameter set whose comparison output signal values │─── 130
│ exhibit the best match with the set of the detected │
│ output signal values │
└─────────────────────────────────────────────┘
```

Fig. 2

MAGNETIC-FIELD SENSOR ARRANGEMENT AND METHOD OF CALIBRATING A MAGNETIC-FIELD SENSOR OF A MAGNETIC-FIELD SENSOR ARRANGEMENT

CROSS-REFERENCE TO RELATED APPLICATION

This application claims priority from German Patent Application No. DE 102020209722.4, which was filed on Jul. 31, 2020, and is incorporated herein in its entirety by reference.

The present invention relates to a magnetic-field sensor arrangement. In addition, the present invention in particular relates to a magnetic-field sensor arrangement comprising an excitation-conductor array having excitation conductors that may be individually driven (enabled) for determining the sensitivity and cross sensitivity of a magnetic-field sensor of the magnetic-field sensor arrangement. In addition, the present invention relates to a method of calibrating a magnetic-field sensor of the magnetic-field sensor arrangement.

BACKGROUND OF THE INVENTION

The magnetic-field sensor arrangement may comprise any magnetic-field sensor such as a vertical and/or horizontal (lateral) Hall sensor, a 3D Hall sensor or a magneto-resistive magnetic-field sensor etc., comprising one or more magnetic-field sensor elements in each case; due to the excitation conductors that may be individually driven, the respective sensitivity and cross sensitivity of the magnetic-field sensor and/or of the individual magnetic-field sensor elements may be determined with very high precision.

The properties of magnetic-field sensors such as, e.g., their sensitivities and/or their locational accuracies and/or orthogonalities (=orthogonal alignments) are dependent on a number of factors and influence variables which have an effect on the magnetic-field sensor. For example, it is already during production of magnetic-field sensors that potential process and manufacturing tolerances of the employed CMOS process including the resulting doping profiles, mask precisions and adjustment tolerances influence and define the properties of the magnetic-field sensors. In addition, it is also possible for parameters present during subsequent operation such as the sensor temperature or the supply voltage applied, for example, to influence and define the properties of the magnetic-field sensor. So as to obtain as accurate measurement values of the magnetic-field sensor as possible, the magnetic-field sensors are consequently calibrated in relation to the temperature. In particular with three-dimensional magnetic-field sensors (e.g., Hall sensors or magneto-resistive sensors), accurate mutual alignment and/or orthogonality of the magnetic-field sensor elements is important here. With a 3D Hall sensor, e.g., three Hall sensor elements are arranged such that their sensitivity directions (if possible starting from a common point of origin or center) are aligned along the three orthogonal spatial axes.

For determining the sensitivity of a magnetic-field sensor, a magnetic field having a known magnetic flux density, if possible, may be generated at the location of the magnetic-field sensor via a coil. By the change in the output signal of the magnetic-field sensor, the sensitivity of the sensor may then be concluded. If the magnetic-field sensor is a Hall sensor, e.g., a vertical or horizontal Hall sensor, the output signal may be a corresponding Hall voltage. With a magnetic-field sensor based on Hall sensors, therefore, the sensitivity of the Hall sensor may be inferred from a change in the Hall voltage, which may be caused by a change in the magnetic flux density in the sensor element.

So far, the sensitivities and orthogonalities of magnetic-field sensors, such as vertical and/or horizontal Hall sensors, are measured in serial tests at various temperatures and are stored as callable values, e.g., in an accessible memory, for later correction. Said sensitivity measurement so far has been conducted by using external Helmholtz coils in a manner involving a very large amount of expenditure, which is why the serial test is costly, extensive and inflexible.

Patent publications DE 10 2010 028 390 B4, EP 2 490 037 B1 and EP 3 341 746 B1 describe integrated conductors and/or coils for determining sensitivities in serial tests without using any external Helmholtz coils, where the accuracy of the sensitivities determined may reach a maximum of about 1%.

Therefore, there is a need for a concept of determining sensitivities and/or of calibrating magnetic-field sensors, wherein the sensitivities and/or locations may be determined with higher accuracy for calibration, wherein the space that may be used for the coil arrangement is as small as possible, and wherein the coil arrangement may be implemented at the magnetic-field sensor to be calibrated with as little expenditure as possible.

SUMMARY

On the basis of the conventional technology presented, the object underlying the present invention consists in providing an improved magnetic-field sensor arrangement and a method of calibrating a magnetic-field sensor of the magnetic-field sensor arrangement by means of which calibration and/or determination of the sensitivities and/or of the locational accuracies (or orthogonalities) of magnetic-field sensors may be performed with as little expenditure and with as high precision as possible.

According to an embodiment, a magnetic-field sensor arrangement may have: a magnetic-field sensor configured to provide a sensor output signal on the basis of a magnetic field acting on the sensor; an excitation-conductor array including a plurality of selectively driveable excitation conductors arranged at a distance from the magnetic-field sensor; a driver for selectively driving the excitation conductors so as to generate different magnetic test fields in the magnetic-field sensor in different drive states by driving a different excitation conductor, and so as to generate a set of detected output signal values of the magnetic-field sensor in accordance with the different drive states; and an evaluator configured to provide different parameter sets including comparison output signal values for the different drive states, the parameter sets representing variations of the architecture of the magnetic-field sensor including the excitation-conductor array, and further configured to determine, on the basis of the set of detected output signal values of the magnetic-field sensor, that parameter set whose comparison output signal values exhibit a best match with the set of detected output signal values.

According to another embodiment, a method of calibrating a magnetic-field sensor of a magnetic-field sensor arrangement, wherein the magnetic-field sensor arrangement includes an excitation-conductor array including a multitude of selectively driveable excitation conductors arranged at a distance from the magnetic-field sensor, may have the steps of: selectively driving the excitation conductors so as to generate different magnetic test fields in the magnetic-field sensor in different drive states by driving a different excitation conductor, and so as to generate a set of detected output signal values of the magnetic-field sensor in accordance with the different drive states; and providing different parameter sets including comparison output signal values for the different drive states, the parameter sets representing variations of the architecture of the magnetic-field sensor including the excitation-conductor array, and determining, on the basis of the set of detected output signal values of the magnetic-field sensor, that parameter set whose comparison output signal values exhibit a best match with the set of detected output signal values.

In accordance with one aspect, a magnetic-field sensor arrangement includes a magnetic-field senor configured to provide a sensor output signal on the basis of a magnetic field acting on the sensor, an excitation-conductor array comprising a plurality of selectively driveable excitation conductors arranged at a distance from the magnetic-field sensor, drive means for selectively driving the excitation conductors so as to generate different magnetic test fields in the magnetic-field sensor in different drive states by driving a different excitation conductor, and so as to generate a set of detected output signal values of the magnetic-field sensor in accordance with the different drive states, and evaluation means configured to provide different parameter sets comprising comparison output signal values for the different drive states, the parameter sets representing variations of the architecture of the magnetic-field sensor comprising the excitation-conductor array, and further configured to determine, on the basis of the set of detected output signal values of the magnetic-field sensor, that parameter set whose comparison output signal values exhibit a best match with the set of detected output signal values.

In accordance with a further aspect, a method of calibrating a magnetic-field sensor of a magnetic-field sensor arrangement, wherein the magnetic-field sensor arrangement comprises an excitation-conductor array comprising a multitude of selectively driveable excitation conductors arranged at a distance from the magnetic-field sensor, includes the following steps:—selectively driving the excitation conductors so as to generate different magnetic test fields in the magnetic-field sensor in different drive states by driving a different excitation conductor, and so as to generate a set of detected output signal values of the magnetic-field sensor in accordance with the different drive states,—providing different parameter sets comprising comparison output signal values for the different drive states, the parameter sets representing variations of the architecture of the magnetic-field sensor comprising the excitation-conductor array, and—determining, on the basis of the set of detected output signal values of the magnetic-field sensor, that parameter set whose comparison output signal values exhibit a best match with the set of detected output signal values.

The core idea of the present invention consists only in that a magnetic-field sensor arrangement comprises a magnetic-field sensor and an excitation-conductor array which is vertically and/or laterally spaced apart therefrom and comprises a plurality of selectively driveable excitation conductors. In addition, there is a "model" of the architecture of the magnetic-field sensor comprising the excitation-conductor array (i.e., the excitation conductor/magnetic-field sensor combination), the sensor model and/or the different parameter sets of the sensor model representing variations of the architecture of the magnetic-field sensor comprising the excitation-conductor array. Variations of the architecture of the magnetic-field sensor comprising the excitation-conductor array relate to the respective actual, real architecture of the magnetic-field sensor comprising the excitation-conductor array. The variations of the architecture of the magnetic-field sensor comprising the excitation-conductor array may also relate to respective differences or deviations between a target architecture (=ideal state) and an actual architecture (=state implemented in reality) of the magnetic-field sensor comprising the excitation-conductor array. Thus, in the sensor model, the effects of the influence variables on the different parameter sets comprising the associated comparison output signal values for the different drive states of the excitation conductors of the excitation-conductor array are taken into account, wherein, for example, a parameter set of the parameter sets provided of the sensor model is associated with, and/or describes, a (or precisely one) variation of the architecture of the magnetic-field sensor comprising the excitation-conductor array.

The excitation-conductor array consists of individually driveable excitation conductors located or arranged, e.g., to be vertically and/or laterally offset from the magnetic-field sensor. The excitation-conductor array comprises, e.g., a relatively large number of individual excitation conductors which are taken into account as influence variables in the sensor model. The more accurately the sensor model (e.g., the Hall sensor model) takes into account the different influence variables, the more accurately the sensitivity (=magnetic sensitivity) of the magnetic-field sensor may be determined during later operation. By using the integrated excitation-conductor array comprising the individually driveable excitation conductors, the sensitivity, location and alignment (e.g. orthogonality) of the magnetic-field sensor, which comprises one or more magnetic-field sensor elements, for example, may be determined (for each sensor element of the sensor).

In accordance with the present concept, the excitation conductors are driven and energized (supplied with current) in different drive states, e.g., for determining the sensitivity of the magnetic-field sensor or for calibrating same, so that different magnetic test fields are generated in the magnetic-field sensor in the different drive states. Thus, the excitation conductors may be energized individually in any order desired, may be energized individually one after the other or may be energized as combination(s) of several excitation conductors together so as to generate the different magnetic test fields in the magnetic-field sensor. The magnetic-field generated by the respective excitation conductor and/or by the respective combination of excitation conductors is measured with the magnetic-field sensor for each drive state and is stored so as to obtain a set of detected output signal values.

Subsequently, the different parameter sets of the sensor model comprising the comparison output signal values for the different drive states are provided, it being possible for the parameter sets of the sensor model to be either determined (e.g., calculated) or be called from a memory. The evaluation means of the magnetic-field sensor arrangement is configured to determine, on the basis of the set of detected output signals of the magnetic-field sensor, that parameter set of the sensor model whose comparison output signals exhibit the best match with or approximation to the set of output signal values detected (by the magnetic-field sensor).

Since a variation of the architecture of the magnetic-field sensor comprising the excitation-conductor array is associated with each parameter set derived from the sensor model, the different variables influencing the system may be determined by means of and/or in connection with the magnetic-field sensor and the excitation-conductor array, i.e., the real (=actual) architecture of the magnetic-field sensor comprising the excitation-conductor array may be determined (with high accuracy). Each influence variable may have a different effect on the resulting sensitivity of the magnetic-field sensor. In accordance with an embodiment, for example, a table may be stored which represents the variations of the architecture of the magnetic-field sensor comprising the excitation-conductor array. On the basis of said table, a study is performed as to which variation (=which parameter set of the sensor model) matches the measured output signal values of the magnetic-field sensor most closely, i.e., which architecture of the magnetic-field sensor comprising the excitation-conductor array may be used as the basis for determining the sensitivity and/or for calibrating the magnetic-field sensor.

In accordance with a further embodiment, the best suited parameter set may be determined from the different parameter sets comprising the comparison output signal values for the different drive states by using a filter or approximation process.

On the basis of the parameter set determined and on the variation associated with said parameter set (=actual implementation) of the architecture of the magnetic-field sensor comprising the excitation-conductor array, the respective effectivity of the individual excitation conductors may be determined, and thus, the sensitivity of the magnetic-field sensor may be determined with an accuracy of 0.1% or higher, i.e., with an accuracy that outclasses known procedures of determining sensitivities by at least one order of magnitude.

If the magnetic-field sensor comprises a plurality of magnetic-field sensor elements (Hall elements), the locations, alignments and/or cross sensitivities (=orthogonalities) of the individual sensor elements may be determined.

In summary, one may therefore state that on the basis of the present concept, a parameter set may be determined which represents the actual architecture of the magnetic-field sensor comprising the excitation-conductor array; subsequently, on the basis of the actual architecture, the sensitivity of the magnetic-field sensor and, further, the location and alignment of the magnetic-field sensor, e.g., with regard to a reference position, may be determined independently of the process tolerances and the operating parameters (for each individual magnetic-field sensor element). With several orthogonal magnetic-field sensor elements for the magnetic-field sensor, it is further possible to determine the orthogonalities (=cross sensitivities) of the magnetic-field sensor elements with extremely high precision. In particular, when determining the sensitivity and cross sensitivity in the manner described here, expensive serial tests employing external Helmholtz coils may be dispensed with, which is why the scalability of the serial tests may be improved, and wherein levels of accuracies may be achieved which would be difficult to implement even when external Helmholtz coils were used.

The approach presented may be essentially applied to any magnetic-field sensors such as, e.g., vertical Hall sensor elements, horizontal Hall sensor elements, magneto-resistive sensor elements, etc.

In accordance with embodiments, the excitation-conductor array may be arranged within one or more metallization planes above (vertically offset from) the magnetic-field sensor element. In accordance with further embodiments, when the magnetic-field sensor is present as a sensor chip, the excitation-conductor array may also be implemented on a circuit board (on which, e.g., the sensor chip is also arranged), in which case the position and location of the sensor chip with regard to a reference position may also be determined.

BRIEF DESCRIPTION OF THE DRAWINGS

Embodiments of the present invention will be detailed subsequently referring to the appended drawings, in which:

FIG. 2 shows a schematic flow chart of a method of calibrating a magnetic-field sensor of a magnetic-field sensor arrangement in accordance with an embodiment.

DETAILED DESCRIPTION OF THE INVENTION

Figure 1A:
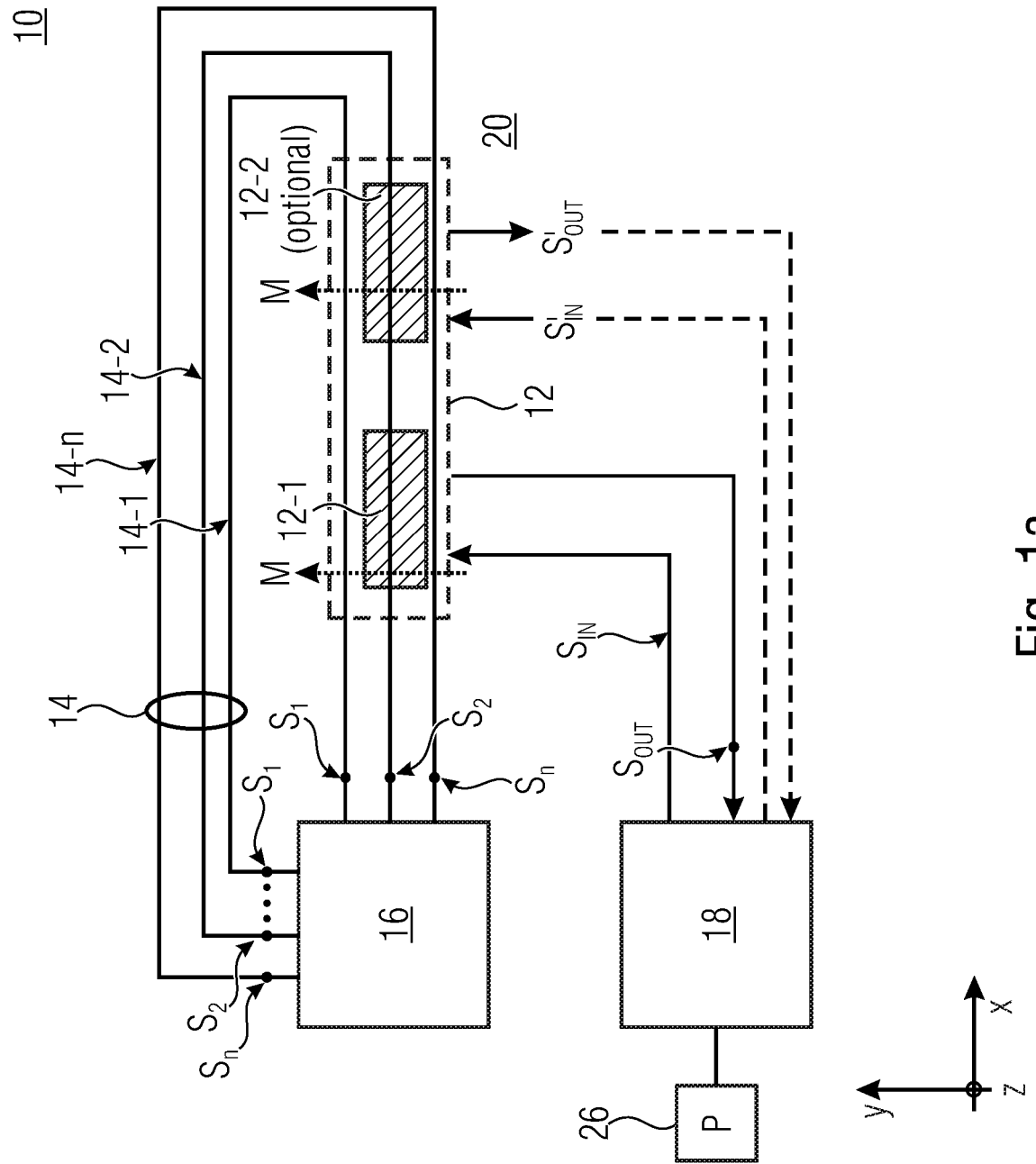
FIG. 1a shows a schematic diagram of a magnetic-field sensor arrangement in accordance with an embodiment.

Before embodiments of the present concept will be explained in detail below by means of the drawings, it shall be noted that elements, objects, functional blocks and/or method steps that are identical, identical in function, or identical in action are provided with the same reference numerals in the various figures, so that the descriptions of said elements, objects, functional blocks and/or method steps that are presented in different embodiments are interchangeable and/or mutually applicable.

Various embodiments will now be explained in more detail with reference to the accompanying drawings, in which some embodiments are depicted. In the figures, dimensions of elements, layers and/or areas presented may not be drawn to scale for reasons of clarity.

It shall be understood that, when an element is referred to as being "connected" or "coupled" to another element, it may be directly connected or coupled to said other element, or intermediate elements may be present. In contrast thereto, if an element is referred to as being "directly" "connected" or "coupled to another element, no intermediate elements will be present. Any other expressions used for describing the relationship between elements are to be construed in the same manner (e.g., "between" as opposed to "directly between", "adjacent" as opposed to "directly adjacent", etc.).

Figure 1B:
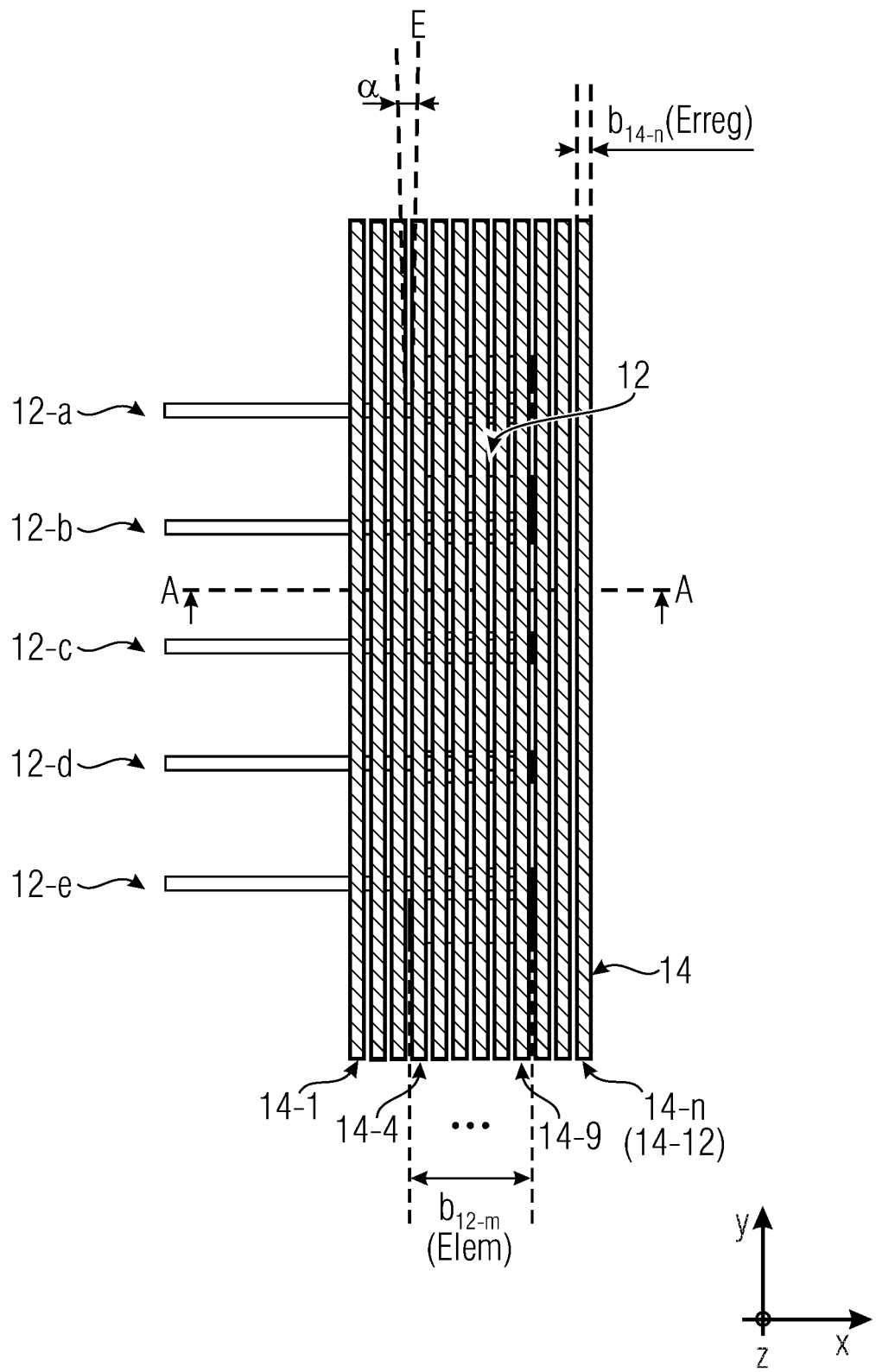
FIG. 1b shows a schematic top view of a magnetic-field sensor comprising an excitation-conductor array of the magnetic-field sensor arrangement in accordance with an embodiment, the magnetic-field sensor comprising a vertical Hall sensor element.

To simplify the descriptions of the different embodiments, the figures comprise a Cartesian coordinate system x, y, z, the directions x, y, z being orthogonally arranged with regard to one another. In the embodiments, the x-y plane corresponds to the main surface area of a carrier or substrate (=reference plane=x-y plane), the upward direction vertical thereto corresponding to the "+z" direction with regard to the reference plane (x-y plane), and the downward direction vertical thereto corresponding to the "−z" direction with regard to the reference plane (x-y plane). In the following description, the expression "lateral" refers to a direction parallel to the x- and/or y direction, i.e., parallel to the x-y plane, the expression "vertical" indicating a direction parallel to the +/−z direction. In FIGS. 1a and 1b, the drawing plane extends in parallel with the x-y plane, and in FIG. 1c, the drawing plane extends in parallel with the x-z plane.

The embodiments which follow relate to magnetic-field sensors which may comprise one or more magnetic-field sensor elements. Even though the embodiments which follow relate to vertical Hall sensor elements as magnetic-field sensor elements in a purely exemplary manner, any other magnetic-field sensor elements such as, e.g., lateral Hall sensor elements, magneto-resistive sensor elements (xMR, GMR, TMR, AMR) may be employed as magnetic-field sensor elements of the magnetic-field sensor. Magnetic-field sensor elements may be produced in a semiconductor substrate by means of semiconductor technology; the semiconductor substrate may comprise a silicon material, for example.

In the following, an exemplary implementation of a magnetic-field sensor arrangement 10 in accordance with an embodiment will be explained by means of FIGS. 1a to c.

FIG. 1a shows schematic diagram of the magnetic-field sensor arrangement 10 in accordance with an embodiment. FIG. 1b shows a schematic top view of an exemplary architecture of the magnetic-field sensor 12 comprising the excitation-conductor array 14 of the magnetic-field sensor arrangement 10, whereas FIG. 1c shows a further schematic partial cross-sectional view, along intersecting lines A-A' of FIG. 1b and in parallel with the x-z plane, of the architecture of the magnetic-field sensor 12 comprising the excitation-conductor array 14.

As depicted by way of example in FIG. 1, the magnetic-field sensor arrangement 10 includes a magnetic-field sensor 12 configured to provide a sensor output signal $S_{out}$ on the basis of a magnetic field M acting on the sensor and of an impressed input signal $S_{in}$.

The excitation-conductor array 14 comprises a plurality (n≥2) or a multitude (n≥3, 4, 5, 10, 12 or 20) of selectively driveable excitation conductors (excitation conductors which are driveable separately from one another) 14-1 . . . 14-n which are arranged at a distance from the magnetic-field sensor 12. Depending on the sensitivity direction of the magnetic-field sensor 12, the excitation-conductor array 14 is arranged to be spaced apart vertically, laterally, or laterally and vertically from the magnetic-field sensor 12 (i.e., its center of gravity and/or center-of-gravity line). At least within the area of activity of the excitation-conductor array 14 for the magnetic-field sensor 12, the excitation conductors 14-1, . . . , 14-n are configured to be in parallel with one another and with the magnetic-field sensor 12.

As is shown by way of example in FIG. 1a, the excitation-conductor array 14 exhibits a lateral extension larger than a lateral extension of the magnetic-field sensor 12; i.e., with regard to a vertical projection, the excitation-conductor array 14 (between the first and $n^{th}$ excitation conductor) completely covers the magnetic-field sensor 12; in the area of coverage (=area of activity) of the excitation-conductor array 14 with the magnetic-field sensor 12, the excitation conductors 14-1, . . . , 14-n are configured to be parallel to one another and to the magnetic-field sensor 12.

The magnetic-field sensor arrangement further comprises a drive means 16 for selectively driving the excitation conductors 14-1 . . . 14-n of the excitation-conductor array 14 by means of corresponding drive signals $S_1, \ldots, S_n$ so as to generate different magnetic test fields M in the magnetic-field sensor 12 in different drive states (for the excitation-conductor array 14) by driving a different excitation conductor 14-1, . . . , 14-n, and so as to generate a set of detected output signal values $S_{out}$ of the magnetic-field sensor 12 in accordance with the different drive states. The number of detected output signal values $S_{out}$ (in the set of detected output signal values $S_{out}$) may correspond, e.g., to the number of different drive states of the excitation-conductor array 14.

The magnetic-field sensor arrangement 10 further includes an evaluation means 18 configured to provide and/or call different parameter sets P, the different parameter sets P comprising comparison output signal values for the different drive states. Within this context, the parameter sets P form variations and/or deviations of the architecture of the magnetic-field sensor 12 comprising the excitation-conductor array 14, e.g., as compared to a target state of the architecture. Variations of the architecture of the magnetic-field sensor 12 comprising the excitation-conductor array 14 relate to the actual, real architecture of the magnetic-field sensor 12 comprising the excitation-conductor array 14. For example, a difference and/or a deviation that has arisen, on account of process tolerances, between the target architecture (ideal state) of the magnetic-field sensor 12 comprising the excitation-conductor array 14 and the real actual architecture (real state) of the magnetic-field sensor 12 comprising the excitation-conductor array 14 is depicted and rendered as a variation and/or deviation of the architecture of the magnetic-field sensor 12 comprising the excitation-conductor array 14.

The evaluation means 18 is further configured to determine, on the basis of the set of output signals $S_{out}$ detected (with the different drive states) of the magnetic-field sensor 12, that parameter set P which has been provided or called and whose comparison output signal values exhibit a best match with the set of the output signal values $S_{out}$ detected by the magnetic-field sensor 12.

On the basis of the determined (real) architecture of the magnetic-field sensor 12 comprising the excitation-conductor array 14, the evaluation means 18 may be further configured to determine the resulting (actual) sensitivity of the magnetic-field sensor 12. On the basis of the determined sensitivity of the magnetic-field sensor 12, the evaluation means 18 may be further configured, in accordance with an embodiment, to calibrate the magnetic-field sensor 12 (for the measuring operation).

In accordance with an embodiment, the drive means 16 and the evaluation means 18 may be implemented as separate means or as a shared processing means, e.g., as an ASIC and/or a microprocessor, at least partly in hardware, and optionally also in software.

In accordance with embodiments, therefore, the magnetic-field sensor 12 may comprise at least one magnetic-field sensor element 12-1 or a plurality of magnetic-field sensor elements 12-1, . . . , 12-m. As is depicted by way of example in FIG. 1a, the magnetic-field sensor 12 may optionally comprise a further magnetic-field sensor element 12-2 so as to provide a further sensor output signal $S'_{out}$ on the basis of a magnetic field M acting on the sensor and of a further impressed input signal $S'_{in}$; i.e., with "m" magnetic-field sensor elements 12-1, . . . , 12-m, "m" sensor output signals are provided on the basis of the magnetic field M acting on the sensor and of "m" impressed input signals.

The magnetic-field sensor element may be implemented as a vertical or lateral Hall sensor element or as a magneto-resistive sensor element. A magneto-resistive sensor element (xMR sensor element) may comprise a GMR (giant magnetoresistance) sensor element, TMR (tunnel magnetoresistance) sensor element or an AMR (anisotropic magnetoresistance) sensor element.

The magnetic-field sensor 12 is configured to provide a sensor output signal $S_{out}$ on the basis of a magnetic field M that is acting on the magnetic-field sensor 12 (=magnetic measurement field), the sensor output signal $S_{out}$ depending on the intensity (magnitude) and direction of the magnetic measurement field which acts on the sensor and penetrates the magnetic-field sensor.

In accordance with an embodiment, the magnetic-field sensor 12 includes at least one magnetic-field sensor element 12-1 or a plurality of magnetic-field sensor elements 12-1, . . . 12-$m$; the at least one magnetic-field sensor element 12-$m$ may be arranged within a semiconductor substrate 20. In order to implement a 3D magnetic-field sensor 12, the magnetic-field sensor 12 may comprise at least three magnetic-field sensor elements 12-1, 12-2, 12-3 which are arranged orthogonally to one another or are sensitive with regard to mutually orthogonal magnetic-field components M. In accordance with an embodiment, the magnetic-field sensor 12 may comprise at least one vertical Hall sensor element 12-1 and/or one lateral Hall sensor element 12-1.

The (integrated) excitation-conductor array 14 comprises the plurality of selectively energizable excitation conductors 14-1 . . . 14-$n$, which are fixedly arranged at a distance from the magnetic-field sensor 12. The excitation conductors 14-1 . . . , 14-$n$ are driveable and/or energizable individually or in combination (as subsets of the excitation-conductor array 14), i.e., they may have a drive signal applied to them.

In accordance with an embodiment, the number n of excitation conductors 14-1, . . . , 14-$n$ of the excitation-conductor array 14 is larger than the number of influence variables taken into account so as to obtain an over-determined system of the mathematical sensor model. The sensor model of the architecture of the magnetic-field sensor 12 comprising the excitation-conductor array 14 and/or the different parameter sets of the sensor model form the variations of the architecture of the magnetic-field sensor 12 comprising the excitation-conductor array 14. The excitation-conductor array 14 is arranged, e.g., within a metallization plane or metallization layer (e.g., M1, M2, M3 and/or M #) 22 or within several metallization planes 22 (e.g., M1, M2, M3 and/or M #) such that it is vertically offset from the magnetic-field sensor 12, e.g., within a metal plane/insulator layer stack (=back-end-of-line stack) 24 on the substrate 20.

In accordance with an embodiment, the excitation-conductor array 14 may also be configured on a PCB (printed circuit board) 20, the PCB 20 being arranged to be vertically offset from the magnetic-field sensor or sensor chip 12 comprising the at least one magnetic-field sensor element 12-$m$.

The drive means 16 is also configured for selective driving and/or energization so as to generate, by impressing the predefined drive signal $S_1$, . . . , $S_n$ into an individual excitation conductor or into a combination of excitation conductors, the predefined magnetic test field M with the predefined, resulting intensity and direction in the magnetic-field sensor 12.

The drive means is further provided for generating and providing the set of detected output signal values $S_{out}$ of the magnetic-field sensor 12 or output signal values $S_{out}$ of the magnetic-field sensor 12 that are derived therefrom (or have been conditioned) in accordance with the different drive states.

In accordance with an embodiment, the drive means 16 is configured to drive and energize, in the different drive states, at least one excitation conductor 14-$n$ or a plurality of excitation conductors 14-1, . . . , 14-$n$ of the excitation-conductor array 14; the excitation conductors 14-1, . . . , 14-$n$ which are individually driven or are driven in combination are different in the different drive states. Thus, the excitation conductors are driven and energized, e.g., for determining the sensitivity of the magnetic-field sensor or for calibrating same in different drive states, so that different magnetic test fields are generated in the magnetic-field sensor 12 in the different drive states. The drive means 16 is also configured to set, during energization, the respective current intensity and current direction in the respective excitation conductor 14-$n$ for producing the magnetic measurement field.

In accordance with an embodiment, the evaluation means 18 is configured to provide and/or to obtain the different parameter sets P which comprise the comparison output signal values for the different drive states, the different parameter sets being associated with different geometric and/or electronic variations (properties or implementations) of the geometric and/or electronic, actual architecture of the magnetic-field sensor 12 comprising the excitation-conductor array 14. The evaluation means 18 is further configured to determine, on the basis of the set of detected output signal values (and/or conditioned output signal values) of the magnetic-field sensor 12, that parameter set, among the parameter sets P provided, whose comparison output signal values comprise a maximum or best match, approximation or similarity (and, optionally, a minimum match) with the set of the detected output signal values.

In accordance with an embodiment, the different parameter sets P comprising the comparison output signal values are based on a model of the architecture of the magnetic-field sensor 12 comprising the excitation-conductor array 14; in the model, a plurality of variables influencing the output signal values $S_{out}$ of the magnetic-field sensor 12 at the different drive states are taken into account.

The model (=sensor model) is based, for example, on a mathematical function, the influence variables including geometric and/or electronic influence variables with regard to the variation of the architecture of the magnetic-field sensor 12 comprising the excitation-conductor array 14.

In the following, a possible architecture of the magnetic-field sensor 12 comprising the excitation-conductor array 14 will be depicted by way of example by means of FIGS. 1$b$ and 1 $c$. for example, FIG. 1$b$ is a schematic top view of the magnetic-field sensor 12 comprising the excitation-conductor array 14 of the magnetic-field sensor arrangement 10, the magnetic-field sensor 12 depicted in FIGS. 1$b$-$c$ comprising, in an exemplary manner only, a vertical Hall sensor element 12-1 comprising five contacts 12-$a$, . . . , 12-$e$ (=5 pinners). FIG. 1$c$ is a schematic partial cross-sectional view of the magnetic-field sensor 12 and the excitation-conductor array 14 of FIG. 1$b$ of the magnetic-field sensor arrangement 10.

As depicted by way of example in FIGS. 1$b$ and 1$c$, the excitation-conductor array 14 comprises, e.g., twelve (generally, a plurality of) excitation conductors 14-1, . . . , 14-12, the excitation-conductor array 14 comprising, e.g., a lateral extension larger than a lateral extension of the magnetic-field sensor 12. With regard to a vertical projection, the excitation-conductor array 14 (between the first and $n^{th}$ excitation conductors) may fully cover, or span, the magnetic-field sensor 12.

In accordance with a further embodiment, the excitation-conductor array 14 may also have a lateral extension equal to or smaller than a lateral extension of the magnetic-field sensor 12. In the depiction of FIGS. 1$b$-$c$, the excitation-conductor array 14 may comprise, e.g., only the excitation conductors 14-4, . . . , 14-9 (or even fewer). With regard to a vertical projection, the excitation-conductor array 14 (between the first and $n^{th}$ excitation conductors and/or between the two outermost excitation conductors) may not fully span the magnetic-field sensor 12. In accordance with embodiments, coverage (with regard to a vertical projection) of the excitation-conductor array 14 above the magnetic-field sensor 12 may amount to, e.g., at least 50%, 75%, or 90%.

The center of gravity and/or the center-of-gravity line $S_{12}$ of the magnetic-field sensor 12 is a (geometric) symmetry line from which the sensitivity direction of the magnetic-field sensor 12 starts, the center-of-gravity line $S_{12}$ defining the geometric distances of the magnetic-field sensor 12 from the excitation conductors 14-1, . . . , 14-n of the excitation array 14. The excitation conductors 14-1, . . . , 14-n of the excitation array 14 are arranged, e.g., (at least in the coverage area/area of activity B with the magnetic-field sensor 12), in parallel with the magnetic-field sensor 12 and/or with the center-of-gravity line $S_{12}$ of the magnetic-field sensor 12.

Figure 1C:
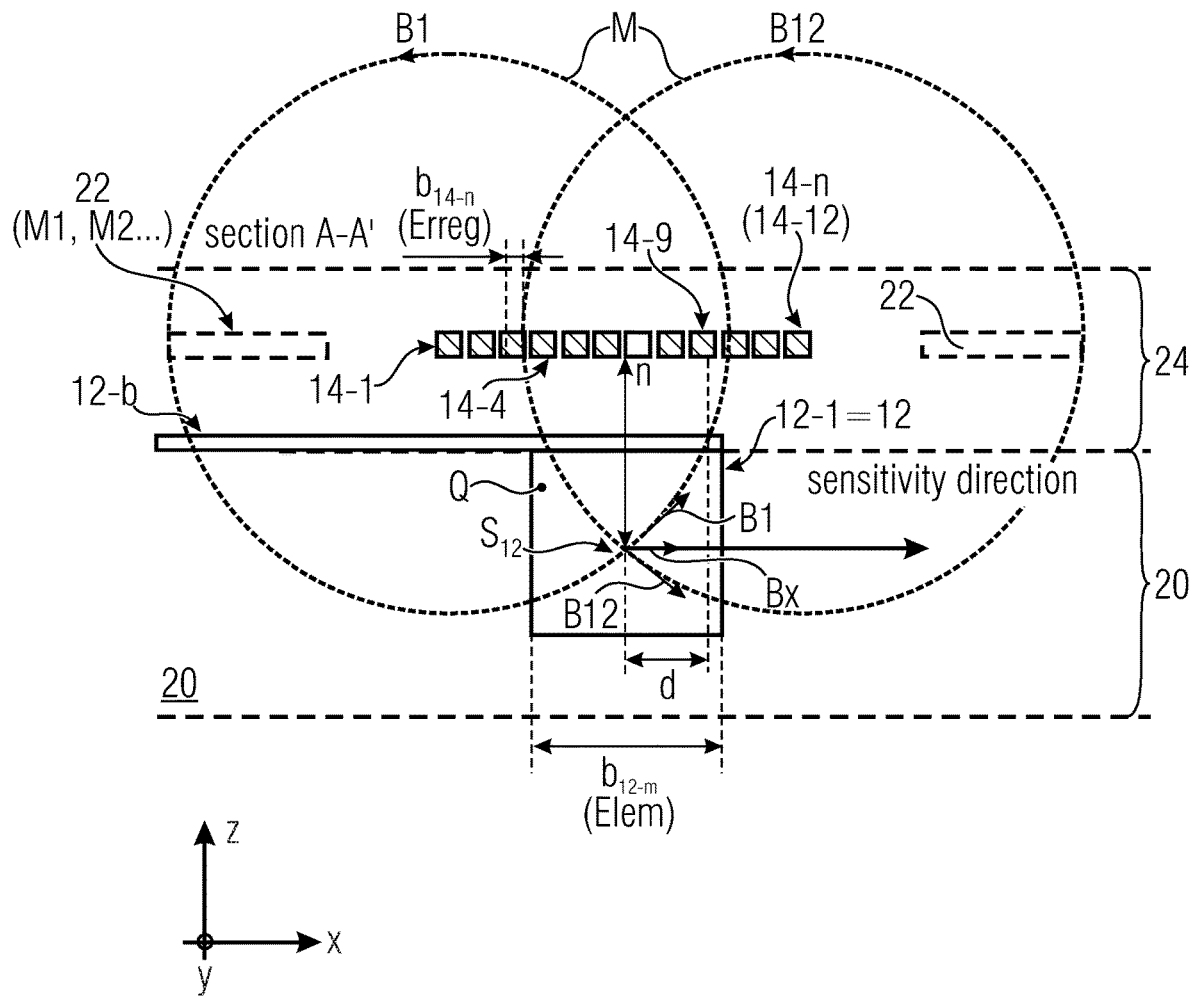
FIG. 1c shows a schematic partial cross-sectional view of the magnetic-field sensor and the excitation-conductor array of FIG. 1b of the magnetic-field sensor arrangement in accordance with an embodiment.

As is also shown in FIG. 1c by way of example, the magnetic-field sensor arrangement 10 includes the magnetic-field sensor 12 configured to provide a sensor output signal $S_{OUT}$ on the basis of the magnetic field M acting on the sensor with the resulting flux density Bx in the center of gravity $S_{12}$ of the magnetic-field sensor 12 and with an impressed input signal $S_{IN}$.

If the input signal $S_{IN}$, e.g., are current, is impressed into one of the excitation conductors 14-1, . . . , 14-n in the −y direction (out of the drawing plane), a magnetic flux density B will be caused, by the flow of current, at the center of gravity $S_{12}$ of the magnetic-field sensor 12. In this embodiment, the magnetic field lines M are radially arranged around the excitation conductor within the x-z plane; a magnetic-field component Bx (=magnetic flux density) may be detected in the x direction (=in parallel with the sensitivity direction) by the sensor element 12 (of FIG. 1c).

FIG. 1c depicts, by way of example, the magnetic flux densities B1, B12 of the excitation conductors 14-1 and 14-12; the magnetic flux densities B2, . . . , B13, which have been generated by the further excitation conductors B2, . . . , B13, act on the magnetic-field sensor 12 accordingly.

The magnetic flux density B is a vector which may be depicted, for example, in a Cartesian coordinate system by means of magnetic-field components Bx, By and Bz which correspond to linearly independent position vectors x, y, z. with a magnetic-field sensor 12 based on Hall sensors, the sensitivity of the magnetic-field sensor 12 may be concluded from a change in the sensor output signal, i.e., the Hall voltage, which is caused by a change in the magnetic flux density B in the center of gravity $S_{12}$ of the sensor element 12.

In accordance with an embodiment, the influence variables for the sensor model may include at least one or a plurality of the following geometric influence variables:

a distance h of the at least one driven excitation conductor 14-n from the at least one magnetic-field sensor element 12-m of the magnetic-field sensor 12, a lateral offset d between the at least one driven excitation conductor 14-n and the at least one magnetic-field sensor element 12-m of the magnetic-field sensor 12, wherein FIG. 1c depicts, by way of example, the vertical offset d between the excitation conductor 14-9 and the center-of-gravity line $S_{12}$ of the magnetic-field sensor element 12-1 of the magnetic-field sensor 12, a cross sensitivity, location or alignment a of the at least one magnetic-field sensor element 12-m of the magnetic-field sensor in relation to a reference point, a reference direction and/or a reference plane E, a width $b_{12-m}$ (Elem) (elem) of the at least one magnetic-field sensor element 12-m of the magnetic-field sensor (12), and/or a width $b_{14-n}$ (Erreg) (excit) of the at least one driven excitation conductor 14-n of the excitation-conductor array 14.

In accordance with one embodiment, the influence variables for the sensor model may include at least one or a plurality of the following electronic influence variables: a dopant quotient or a dopant distribution Q of the at least one magnetic-field sensor element 12-m in the semiconductor material 20, and/or a position of the geometric center of gravity, or center-of-gravity line, $S_{12}$ of the at least one magnetic-field sensor element 12-m of the magnetic-field sensor 12 as a function of the temperature on account of the temperature dependence of the formation of the depletion region of the at least one magnetic-field sensor element 12-m in the semiconductor material of the substrate 20 on the temperature.

In accordance with one embodiment, the architecture of the magnetic-field sensor 12 comprising the excitation-conductor array 14 may be described by the following mathematical representation:

Sensor Model 1 (f1):

$$f1(h, d, Elem, Erreg, \alpha) :=$$

$$\frac{\int_{-\frac{Erreg}{2}}^{\frac{Erreg}{2}} \int_{-\frac{Elem}{2}}^{\frac{Elem}{2}} \frac{\mu_0 \cdot \mu_r}{2 \cdot \pi} \left( \frac{I_E}{RA(h, d, x_{Elem}, x_{Erreg}, \alpha)} \right) \cdot \cos\left(\alpha + \operatorname{atan}\left(\frac{XA(d, x_{Elem}, x_{Erreg}, \alpha)}{ZA(h, x_{Elem}, \alpha)}\right)\right) dx_{Elem} dx_{Erreg}}{Elem \cdot Erreg}$$

$$XA(d, x_{Elem}, x_{Erreg}, \alpha) := d + x_{Erreg} - \cos(\alpha) \cdot x_{Elem}$$

$$ZA(h, x_{Elem}, \alpha) := h - \sin(\alpha) \cdot x_{Elem}$$

$$RA(h, d, x_{Elem}, x_{Erreg}, \alpha) := \sqrt{XA(d, x_{Elem}, x_{Erreg}, \alpha)^2 + ZA(h, x_{Elem}, \alpha)^2}$$

comprising:

"h" is the vertical distance (=vertical offset) of the at least one driven excitation conductor 14-n from the at least one magnetic-field sensor element 12-m of the magnetic-field sensor 12, "d" is the lateral distande (=lateral offset) between the at least one driven excitation conductor 14-n and the at least one magnetic-field sensor element 12-m of the magnetic-field sensor 12, "$\alpha$" is the cross sensitivity, location or alignment of the at least one magnetic-field sensor element 12-m of the magnetic-field sensor 12 in relation to a reference point, a reference direction and/or a reference plane E, "Elem" (elem) (=$b_{12-m}$) is the width of the at least one magnetic-field sensor element 12-m of the magnetic-field sensor 12, and "Erreg" (excit) (=$b_{14-n}$) is the width of the at least one driven excitation conductor 14-n of the excitation-conductor array 14.

In the above-depicted sensor model 1, therefore, the distance (height) h, the lateral (side) offset d, the element width (=Elem), the conductor width $b_{14-n}$ (=Erreg) and the element tilt (cross sensitivity, location or alignment) a are variable and each form an influence variable for the sensor model.

XA is a function which takes into account, with the lateral offset d (=lateral distance) of the respectively activated excitation conductor 14-n with regard to the center of gravity, or the center-of-gravity line, $S_{12}$ of the magnetic-field sensor 12, the width $b_{14-n}$ (Elem=$x_{Elem}$) of the magnetic-field sensor 12-*m*, the width (Erreg=$x_{Erreg}$) of the excitation conductor 14-*n*, and the tilting angle "α" (=cross sensitivity).

ZA is a function which takes into account, with the vertical offset h (=vertical distance) of the respectively activated excitation conductor 14-*n* with regard to the center of gravity, or the center-of-gravity line, $S_{12}$ of the magnetic-field sensor 12, the width (Elem=$x_{Elem}$) of the magnetic-field sensor 12-*m* and the tilting angle "α" (=cross sensitivity).

Moreover, RA is a function for the radius (=distance) between the respectively activated excitation conductor 14-*n* with regard to the center of gravity, or the center-of-gravity line, $S_{12}$ of the magnetic-field sensor 12, wherein XA and ZA are taken into account.

In accordance with an embodiment, the number n of the excitation conductors 14-1, . . . , 14-*n* of the excitation-conductor array 14 is larger than the number of influence variables to be taken into account so as to obtain an over-determined system of the mathematical model, i.e., a system comprising more independent equations than unknowns.

In accordance with an embodiment, the parameter sets P comprising the comparison output signal values are stored as a table in a memory 26 accessible to the evaluation means 18, wherein the evaluation means 18 is further configured to determine which set of the measured output signal values $S_{out}$ and which parameter set P exhibit the best match with each other.

In accordance with an embodiment, the evaluation means 18 is further configured to determine, on the basis of the determined parameter set P, the associated influence variables and, thus, the actual architecture of the magnetic-field sensor 12 comprising the excitation-conductor array 14.

In accordance with an embodiment, the evaluation means 18 is further configured to determine, by means of a comparison, which set of the measured output signal values $S_{out}$ and which parameter set P exhibit the best match with each other.

In accordance with an embodiment, the evaluation means 18 is further configured to determine the parameter set P exhibiting the best match with the output signal values $S_{out}$ by means of a filtering and/or approximation process, e.g. a fitting function.

In the following, further sensor models comprising different numbers of influence variables that are taken into account will be depicted with reference to FIGS. 1*b* and 1*c* with the vertical Hall sensor element 12-1 as the magnetic-field sensor 12.

In the sensor model 2 depicted below, the distance (height) h, the lateral (side) offset d, the element width $b_{12-m}$ (=Elem) and the conductor width $b_{14-n}$ (=Erreg) are variable and each form an influence variable for the sensor model. The element tilt (cross sensitivity, location or alignment) α, e.g., is not taken into account, or will be assumed as being fixed.

Sensor Model 2 (f2):

$$f2(h, d, Elem, Erreg) := \frac{\int_{-\frac{Erreg}{2}}^{\frac{Erreg}{2}} \int_{-\frac{Elem}{2}}^{\frac{Elem}{2}} \frac{\mu_0 \cdot \mu_r}{2 \cdot \pi} \cdot (I_E) \cdot \frac{h}{(d + x_{Erreg} - x_{Elem})^2 + h^2} dx_{Elem} dx_{Erreg}}{Elem \cdot Erreg}$$

In the sensor model 3 depicted below, the distance (height) h, the lateral (side) offset d and the element width $b_{12-m}$ (=Elem) are variable and each form an influence variable for the sensor model. The conductor width $b_{14-n}$ (=Erreg) and the element tilt (cross sensitivity, location or alignment) α, e.g., are not taken into account, or will be assumed as being fixed.

Sensor Model 3 (f3):

$$f3(h, d, Elem) := \frac{\int_{-\frac{1 \cdot 10^{-6}m}{2}}^{\frac{1 \cdot 10^{-6}m}{2}} \int_{-\frac{Elem}{2}}^{\frac{Elem}{2}} \frac{\mu_0 \cdot \mu_r}{2 \cdot \pi} \cdot (I_E) \cdot \frac{h}{(d + x_{Erreg} - x_{Elem})^2 + h^2} dx_{Elem} dx_{Erreg}}{7 \times 10^{-6} \cdot (1 \cdot 10^{-6}m)}$$

In the sensor model 4 depicted below, the distance (height) h and the lateral (side) offset d are variable and each form an influence variable for the sensor model. The element width $b_{12-m}$ (=Elem), the conductor width $b_{14-n}$ (=Erreg) and the element tilt (cross sensitivity, location or alignment) α, e.g., are not taken into account, or will be assumed as being fixed.

Sensor Model 4 (f4):

$$f4(h, d) := \frac{\int_{-\frac{1 \cdot 10^{-6}m}{2}}^{\frac{1 \cdot 10^{-6}m}{2}} \int_{-\frac{7 \times 10^{-6}m}{2}}^{\frac{7 \times 10^{-6}m}{2}} \frac{\mu_0 \cdot \mu_r}{2 \cdot \pi} \cdot (I_E) \cdot \frac{h}{(d + x_{Erreg} - x_{Elem})^2 + h^2} dx_{Elem} dx_{Erreg}}{7 \times 10^{-6} m \cdot (1 \cdot 10^{-6}m)}$$

In the sensor model 5 depicted below, the distance (height) h is variable and forms the influence variable for the sensor model. The lateral (side) offset d, the element width $b_{12-m}$ (=Elem), the conductor width $b_{14-n}$ (=Erreg) and the element tilt (cross sensitivity, location or alignment) α, e.g., are not taken into account, or will be assumed as being fixed.

Sensor Model 5 (f5):

$$f5(h) := \frac{\int_{-\frac{1 \cdot 10^{-6}m}{2}}^{\frac{1 \cdot 10^{-6}m}{2}} \int_{-\frac{7 \times 10^{-6}m}{2}}^{\frac{7 \times 10^{-6}m}{2}} \frac{\mu_0 \cdot \mu_r}{2 \cdot \pi} \cdot (I_E) \cdot \frac{h}{(6 \times 10^{-6}m + x_{Erreg} - x_{Elem})^2 + h^2} dx_{Elem} dx_{Erreg}}{7 \times 10^{-6} m \cdot (1 \cdot 10^{-6}m)}$$

The concept described for determining sensitivities and/or for calibrating magnetic-field sensors 12 may achieve a high level of accuracy of determining the sensitivity and/or location of the magnetic-field sensor 12 for calibration; the space that may be used for the coil arrangement (=the excitation-conductor array) 14 is relatively low, and the coil arrangement 14 as the excitation-conductor array may be implemented, with little expenditure, at the magnetic-field sensor 12 to be calibrated, and without any additional evaluation cycle (e.g., for CMOS processes).

Several essential aspects and technical effects of the magnetic-field sensor arrangement 10 will once again be presented and summarized below.

The magnetic-field sensor arrangement 10 is characterized in that the sensitivity and orthogonality of the magnetic-field sensor 12, e.g., of a vertical Hall sensor, may be determined irrespective of process tolerances and operating parameters. To this end, the integrated excitation-conductor array 14 is used, which need not be adapted to the respective magnetic-field sensor, and a model (=sensor model) of the excitation conductor/magnetic-field sensor combination may be used. The excitation-conductor array 14 comprises individually driveable excitation conductors placed above the magnetic-field sensor 12. Within this context, the number of excitation conductors 14-*n* that may be used is larger than the number of influence variables (influencing the sensor model) to be taken into account. The higher the level of precision with which the sensor model (e.g., the Hall model) takes into account the influence variables, the more accurately the sensitivity may be determined during later operation.

As is depicted in FIGS. 1*s* to 1*c*, therefore, the inventive excitation-conductor array comprises several excitation conductors 14-*n* which are driveable separately from one another; by way of example, FIGS. 1*b* and 1*c* show an excitation-conductor array 14 comprising n=12 excitation conductors.

Within this context, the sensor model takes into account, e.g., the following (geometry-related) influence variables (see, e.g., FIGS. 1*b* and 1*c*). By "h", e.g., effects are taken into account which impact the distance of the excitation conductor 14-*n* from the sensor 12. By "d", e.g., effects are taken into account which impact the lateral offset between the excitation conductor 14-*n* and the sensor 12. By "α", e.g., the cross sensitivity (orthogonality) of the sensor 12 is taken into account. By "Elem", e.g., the width of the sensor 12 and/or of the sensor element 12-*m* is taken into account. By "Erreg", e.g., the width of the excitation conductor 14-*n* is taken into account.

The sensor model also takes into account the following (electronic) influence variables, for example. On the basis of process tolerances, for example, the dopant quotient or the dopant distribution of the at least one magnetic-field sensor element 12-*m* in the semiconductor material 20 may form an influence variable to be taken into account. The dopant distribution of the magnetic-field sensor may also influence the position of the geometric center of gravity, or center-of-gravity line, $S_{12}$ of the magnetic-field sensor 12. In addition, the position of the geometric center of gravity, or center-of-gravity line, $S_{12}$ of the at least one magnetic-field sensor element 12-*m* of the magnetic-field sensor 12 may form, as a function of the temperature (=ambient temperature or sensor temperature), an influence variable to be taken into account since the formation of the depletion region of the at least one magnetic-field sensor element 12-*m* in the semiconductor material 20 is dependent on the temperature. The actual position of the geometric center of gravity, or center-of-gravity line, $S_{12}$ of the magnetic-field sensor 12 may thus also have an effect on the geometric influence variables, i.e., on the geometric relationship (distance, alignment, etc.) between the magnetic-field sensor 12 and the respective excitation conductor 14-*n*.

During the calibration process, the excitation conductors 14-*n* may be operated (=driven) one after the other or in combinations. The magnetic field M generated by the excitation conductor 14-*n* is measured with the magnetic-field sensor 12, e.g., a Hall sensor, and stored. Subsequently, the parameters taken into account in the model are determined. There are various possibilities of doing so.

A) A table may be stored which indicates the variations. Subsequently, a check is performed as to which of the variation best matches the measured values.

B) The parameter set exhibiting the best match is determined via filters or approximation processes. AI (artificial intelligence) methods may also be employed in this context, for example.

With the parameters now known, the effectiveness of the individual excitation conductors 14-*n* may be determined, and, thus, the sensitivity may be determined with a higher accuracy than 0.1%. The cross sensitivity may be determined, e.g., as a parameter in a first or a preceding step.

In accordance with embodiments, it is also possible to implement variations of the inventive concept. For example, the concept described here, i.e., the device and/or the method, is also suitable for other types of magnetic-field sensors 12 and also for a different architecture of the magnetic-field sensor comprising the excitation-conductor array and, thus, also for other sensor models. Moreover, the excitation-conductor array 14 may also be implemented on the PCB (printed circuit board). In this manner, the positions and locations (e.g., alignments) of the sensor chips 12 may be determined.

The above-described magnetic-field sensor arrangement 10 may dispense with an expensive serial test for determining the sensitivity and cross sensitivity of the magnetic-field sensor. Moreover, in determining the sensitivity and cross sensitivity, very high speeds may be achieved which are hard to attain even when using external Helmholtz coils.

In addition, by using the above-described magnetic-field sensor arrangement 10, it is possible to measure integrated sensitivities and orthogonalities of the magnetic-field sensors 12, e.g., of vertical Hall sensors, in an extremely effective manner during operation or even in a serial test.

A schematic flow chart of a method 100 of calibrating a magnetic-field sensor 12 of a magnetic-field sensor arrangement 10 in accordance with a further embodiment will now be described by means of FIG. 2.

In the method 100 of calibrating a magnetic-field sensor 12 of the magnetic-field sensor arrangement 10, the magnetic-field sensor arrangement 10 comprises an excitation-conductor array 14 comprising a multitude (n>=3) of selectively driveable excitation conductors 14-1, . . . . 14-*n*, which are arranged at a distance from the magnetic-field sensor 12. The magnetic-field sensor arrangement 10 may also be configured in accordance with the embodiments depicted by means of FIGS. 1*a-c*, for example.

The method 100 includes the step 110 of selectively driving the excitation conductors 14-1, . . . , 14-*n* so as to generate different magnetic test fields M in the magnetic-field sensor 12 in different drive states by driving a different excitation conductor 14-*n*, and so as to generate a set of detected output signal values $S_{out}$ of the magnetic-field sensor 12 in accordance with the different drive states.

The method further includes step 120 of providing different parameter sets comprising comparison output signal values for the different drive states, the parameter sets representing variations of the architecture of the magnetic-field sensor 12 comprising the excitation-conductor array 14.

The method also includes step 130 of determining, on the basis of the set of detected output signal values of the magnetic-field sensor 12, that parameter set whose comparison output signal values exhibit the best match with the set of the detected output signal values.

In accordance with an embodiment, the method 100 may further include the following step 140 of determining the sensitivity of the magnetic-field sensor on the basis of the determined architecture of the magnetic-field sensor comprising the excitation-conductor array.

In accordance with an embodiment, the method 100 may further include the following step 150 of calibrating the magnetic-field sensor 12 on the basis of the determined sensitivity of the magnetic-field sensor 12.

In accordance with an embodiment, the method 100 may further comprise the following step 160 of determining the architecture of the magnetic-field sensor 12 comprising the excitation-conductor array 14 on the basis of the determined parameter set by means of a comparison as to which set of the measured output signal values and which parameter set exhibit the best match with each other.

Even though some aspects of the present disclosure have been described as features within the context of a device, it is understood that such a description may also be regarded as a description of corresponding method features. Even though some aspects e have been described as features within the context of a method, it is understood that such a description may also be regarded as a description of corresponding features of a device or functionality of a device. Some or all of the method steps may be performed by a hardware device (or while using a hardware device) such as a microprocessor, a programmable computer or an electronic circuit, for example. In some embodiments, some or several of the method steps may be performed by such a device. Depending on specific implementation requirements, embodiments of the invention may be implemented in hardware or in software or at least partly in hardware or at least partly in software.

In the above detailed description, various features were sometimes grouped in examples so as to streamline the disclosure. This kind of disclosure is not to be interpreted as an intention that the claimed examples comprise more features than are explicitly indicated in each claim. Rather, as will be set forth in the following claims, the subject matter may consist in less than all of the features of one individual disclosed example. Consequently, the following claims will thus be included in the detailed description, and each claim may represent a separate example of its own. While each claim may represent a separate example of its own, it shall be noted that, even though dependent claims in the claims are dependent on a specific combination with one or more other claims, other examples shall also include a combination of dependent claims with the subject matter of every other dependent claim or with a combination of each feature with other dependent or independent claims. Such combinations shall be included unless it is set forth that a specific combination is not intended. Moreover, it is intended that also a combination of features of a claim with any other independent claim shall be included, even if said claim is not directly dependent on the independent claim.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. Magnetic-field sensor arrangement comprising:
a magnetic-field sensor configured to provide a sensor output signal on the basis of a magnetic field acting on the sensor;
an excitation-conductor array comprising at least three selectively drivable excitation conductors arranged at a distance from the magnetic-field sensor;
a driver for selectively driving the at least three excitation conductors so as to generate different magnetic test fields in the magnetic-field sensor in different drive states by driving a different excitation conductor of the at least three excitation conductors, and so as to generate a set of detected output signal values of the magnetic-field sensor in accordance with the different drive states; and
an evaluator configured to provide different parameter sets comprising comparison output signal values for the different drive states, the parameter sets representing variations of the architecture of the magnetic-field sensor comprising the excitation-conductor array, and further configured to determine, on the basis of the set of detected output signal values of the magnetic-field sensor, that parameter set whose comparison output signal values exhibit a best match with the set of detected output signal values.

2. Magnetic-field sensor arrangement as claimed in claim 1, wherein the evaluator is further configured to determine the sensitivity of the magnetic-field sensor on the basis of the determined architecture of the magnetic-field sensor comprising the excitation-conductor array.

3. Magnetic-field sensor arrangement as claimed in claim 2, wherein the evaluator is further configured to calibrate the magnetic-field sensor on the basis of the determined sensitivity of the magnetic-field sensor.

4. Magnetic-field sensor arrangement as claimed in claim 1, wherein the different parameter sets exhibiting the comparison output signal values are based on a model of the architecture of the magnetic-field sensor comprising the excitation-conductor array, wherein a plurality of variables influencing the output signal values of the magnetic-field sensor in the different drive states are taken into account in the model.

5. Magnetic-field sensor arrangement as claimed in claim 4, wherein the model is based on a mathematical function and wherein the influence variables comprise geometric and/or electronic influence variables with regard to the variation of the architecture of the magnetic-field sensor comprising the excitation-conductor array.

6. Magnetic-field sensor arrangement as claimed in claim 1, wherein the magnetic-field sensor comprises at least one magnetic-field sensor element or a plurality of magnetic-field sensor elements in a semiconductor substrate, and wherein the driver is configured to drive and energize, in the different drive states, at least one excitation conductor or a plurality of excitation conductors of the excitation-conductor array, wherein the excitation conductors which are driven individually or driven in combination are different in the different drive states.

7. Magnetic-field sensor arrangement as claimed in claim 4, wherein the influence variables comprise at least one or a plurality of the following geometric influence variables:
a distance of the at least one driven excitation conductor from the at least one magnetic-field sensor element of the magnetic-field sensor,
a lateral offset between the at least one driven excitation conductor and the at least one magnetic-field sensor element of the magnetic-field sensor,
a cross sensitivity, location or alignment of the at least one magnetic-field sensor element of the magnetic-field sensor in relation to a reference point, a reference direction and/or a reference plane,
a width (Elem) of the at least one magnetic-field sensor element of the magnetic-field sensor, and/or a width (Erreg) of the at least one driven excitation conductor.

8. Magnetic-field sensor arrangement as claimed in claim 4, wherein the influence variables comprise at least one or a plurality of the following electronic influence variables:
   a dopant quotient or a dopant distribution of the at least one magnetic-field sensor element in the semiconductor material, and/or
   a position of the geometric center of gravity of the at least one magnetic-field sensor element of the magnetic-field sensor as a function of the temperature on account of the dependence of the formation of the depletion region of the at least one magnetic-field sensor element in the semiconductor material on the temperature.

9. Magnetic-field sensor arrangement as claimed in claim 1, wherein the architecture of the magnetic-field sensor comprising the excitation-conductor array is described by the following mathematical representation:

$$f1(h, d, Elem, Erreg, \alpha) :=$$

$$\frac{\int_{-\frac{Erreg}{2}}^{\frac{Erreg}{2}} \int_{-\frac{Elem}{2}}^{\frac{Elem}{2}} \frac{\mu_0 \cdot \mu_r}{2 \cdot \pi} \left( \frac{I_E}{RA(h, d, x_{Elem}, x_{Erreg}, \alpha)} \right) \cdot \cos\left(\alpha + \mathrm{atan}\left(\frac{XA(d, x_{Elem}, x_{Erreg}, \alpha)}{ZA(h, x_{Elem}, \alpha)}\right)\right) dx_{Elem} dx_{Erreg}}{Elem \cdot Erreg}$$

$$XA(d, x_{Elem}, x_{Erreg}, \alpha) := d + x_{Erreg} - \cos(\alpha) \cdot x_{Elem}$$

$$ZA(h, x_{Elem}, \alpha) := h - \sin(\alpha) \cdot x_{Elem}$$

$$RA(h, d, x_{Elem}, x_{Erreg}, \alpha) := \sqrt{XA(d, x_{Elem}, x_{Erreg}, \alpha)^2 + ZA(h, x_{Elem}, \alpha)}$$

comprising:
"h" is the distance of the at least one driven excitation conductor from the at least one magnetic-field sensor element of the magnetic-field sensor,
"d" is the lateral offset between the at least one driven excitation conductor and the at least one magnetic-field sensor element of the magnetic-field sensor,
"$\alpha$" is the cross sensitivity, location or alignment of the at least one magnetic-field sensor element of the magnetic-field sensor in relation to a reference point, a reference direction and/or a reference plane,
"Elem" is the width of the at least one magnetic-field sensor element of the magnetic-field sensor, and
"Erreg" is the width of the at least one driven excitation conductor.

10. Magnetic-field sensor arrangement as claimed in claim 4, wherein the number of the at least three excitation conductors of the excitation-conductor array is larger than the number of influence variables to be taken into account so as to achieve an over-determined system of the mathematical model.

11. Magnetic-field sensor arrangement as claimed in claim 1, wherein the parameter sets comprising the comparison output signal values are stored as a table in a memory accessible to the evaluator, and wherein the evaluator is configured to determine which set of the measured output signal values and which parameter set exhibit the best match with each other.

12. Magnetic-field sensor arrangement as claimed in claim 4, wherein the evaluator is further configured to determine, on the basis of the determined parameter set, the associated influence variables and, accordingly, the architecture of the magnetic-field sensor comprising the excitation-conductor array.

13. Magnetic-field sensor arrangement as claimed in claim 1, wherein the evaluator is configured to determine, by means of a comparison, which set of the measured output signal values and which parameter set exhibit the best match with each other.

14. Magnetic-field sensor arrangement as claimed in claim 1, wherein the evaluator is configured to determine the parameter set exhibiting the best match with the output signal values by means of filtering and/or approximation processes.

15. Magnetic-field sensor arrangement as claimed in claim 1, wherein the magnetic-field sensor comprises at least three magnetic-field sensor elements which are arranged orthogonally in relation to one another or are sensitive with regard to mutually orthogonal magnetic-field components, so as to implement a 3D magnetic-field sensor.

16. Magnetic-field sensor arrangement as claimed in claim 1, wherein the magnetic-field sensor comprises at least a vertical Hall sensor element and/or a lateral Hall sensor element.

17. Magnetic-field sensor arrangement as claimed in claim 1, wherein the excitation-conductor array is arranged within a metallization plane or within several metallization planes such that it is vertically offset from the magnetic-field sensor.

18. Magnetic-field sensor arrangement as claimed in claim 1, wherein the excitation-conductor array is configured on a PCB, the PCB being arranged to be vertically offset from the magnetic-field sensor or sensor chip comprising the at least one magnetic-field sensor element.

19. Magnetic-field sensor arrangement as claimed in claim 1, wherein the driver is configured to adjust, in the energization, the respective current intensity and current direction of the drive signal in the respective excitation conductor for producing the magnetic measurement field.

20. Method of calibrating a magnetic-field sensor of a magnetic-field sensor arrangement, wherein the magnetic-field sensor arrangement comprises an excitation-conductor array comprising at least three selectively drivable excitation conductors arranged at a distance from the magnetic-field sensor, the method comprising:
   selectively driving the at least three excitation conductors so as to generate different magnetic test fields in the magnetic-field sensor in different drive states by driving a different excitation conductor of the at least three excitation conductors, and so as to generate a set of detected output signal values of the magnetic-field sensor in accordance with the different drive states; and
   providing different parameter sets comprising comparison output signal values for the different drive states, the parameter sets representing variations of the architecture of the magnetic-field sensor comprising the excitation-conductor array, and
   determining, on the basis of the set of detected output signal values of the magnetic-field sensor, that parameter set whose comparison output signal values exhibit a best match with the set of detected output signal values.

21. Method as claimed in claim 20, further comprising:
   determining the sensitivity of the magnetic-field sensor on the basis of the determined architecture of the magnetic-field sensor comprising the excitation-conductor array.

22. Method as claimed in claim 20, further comprising:
   calibrating the magnetic-field sensor on the basis of the determined sensitivity of the magnetic-field sensor.

23. Method as claimed in claim 20, further comprising:
  determining the architecture of the magnetic-field sensor comprising the excitation-conductor array on the basis of the determined parameter set by means of a comparison in terms of which set of the measured output signal values and which parameter set exhibit the best match with each other.

* * * * *